us 008290459B2

United States Patent
Lagunas et al.

(10) Patent No.: US 8,290,459 B2
(45) Date of Patent: Oct. 16, 2012

(54) SIGNAL PROCESSING DEVICE AND METHOD FOR DETECTING AND LOCATING SPECTRAL SHAPES

(75) Inventors: Miguel Angel Lagunas, Barcelona (ES); Ana Pérez Neira, Barcelona (ES); Xavier Mestre, Barcelona (ES); Miguel Angel Rojas, Barcelona (ES)

(73) Assignee: Fundacio Centre Tecnologic de Telecomunicacions de Catalunya, Castelldefels (Barcelona) (ES)

( * ) Notice: Subject to any disclaimer, the term of this patent is extended or adjusted under 35 U.S.C. 154(b) by 53 days.

(21) Appl. No.: 12/995,336

(22) PCT Filed: Jun. 25, 2008

(86) PCT No.: PCT/EP2008/058098
§ 371 (c)(1),
(2), (4) Date: Feb. 22, 2011

(87) PCT Pub. No.: WO2009/143902
PCT Pub. Date: Dec. 3, 2009

(65) Prior Publication Data
US 2011/0143700 A1    Jun. 16, 2011

(30) Foreign Application Priority Data
May 30, 2008  (ES) .................................. P200801636

(51) Int. Cl.
*H04B 17/00* (2006.01)
(52) U.S. Cl. .................. 455/226.1; 455/67.11; 375/219
(58) Field of Classification Search ............... 455/67.11, 455/73, 226.1; 375/219
See application file for complete search history.

(56) References Cited

U.S. PATENT DOCUMENTS

| | | | | |
|---|---|---|---|---|
| 7,010,052 B2 * | 3/2006 | Dill et al. | ....................... | 375/265 |
| 7,346,013 B2 * | 3/2008 | Garmany et al. | ............. | 370/286 |
| 7,751,494 B2 * | 7/2010 | Borkar et al. | ................. | 375/267 |
| 7,769,098 B2 * | 8/2010 | Borkar et al. | ................. | 375/267 |
| 2010/0285849 A1 * | 11/2010 | Porjo et al. | ..................... | 455/574 |

OTHER PUBLICATIONS

International Search Report dated Feb. 9, 2009, from the corresponding PCT/EP2008/058098.
International Preliminary Report on Patentability dated Nov. 30, 2010, from the corresponding PCT/EP2008/058098.
Written Opinion dated Feb. 9, 2009, from the corresponding PCT/EP2008/058098.
Antonio De Maio, "Robust Adaptive Radar Detection in the Presence of Steering Vector Mismathces", IEEE Transactions on Aerospace and Electronic Systems, vol. 41, Issue 4, pp. 1322-1337, Oct. 2005.
William A. Gardner, "Signal Interception: A Unifying theoretical Framework for Feature Detection", IEEE Transactions on Communications, vol. 36, Issue 8, pp. 897-906, Aug. 1988.
David J. Thomson, "Spectrum Estimation and Harmonic Analysis", Proceedings of the IEEE, vol. 70, No. 9, Sep. 1982, pp. 1055-1096.
Miguel A. Rojas, et al. "Candidate Spectral Estimation for Cognitive Radio", Proceedings of the 11th WSEAS International Conference on Communications, pp. 1-8, Jul. 2007.

* cited by examiner

*Primary Examiner* — Nhan Le
(74) *Attorney, Agent, or Firm* — Katten Muchin Rosenman LLP (57) ABSTRACT

Method and device for detecting a target spectrum and its frequency location in a scenario contaminated with strong jammers on other interferers. The detection is based on the geodesic distance between the correlation matrix (RD) of the received signal and the correlation matrix (RT) of the target spectrum (TS) which is assumed known in shape and bandwidth. The detection happens when the threshold (Formula (I)) is overcome. The frequency location is based on the minimization of the mean square error between RD and RT.

12 Claims, 6 Drawing Sheets

SIGNAL PROCESSING DEVICE AND METHOD FOR DETECTING AND LOCATING SPECTRAL SHAPES

FIELD OF THE INVENTION

The present invention relates generally to the field of statistical signal processing, more particularly, deals with a spectral estimation method and device able to detect in data records the presence or absence of a target spectrum or potential threat and, if so, locate it in frequency.

STATE OF THE ART

One of the key problems in electromagnetic spectrum analysis is to find fundamentals that allow the scanner to be driven by pure frequencies so that a specific spectral shape or correlation signature of a target spectrum (TS) can be detected.

The target spectrum (TS) presents an electronic activity which is assumed to be known in shape and bandwidth, but the power level and the frequency location of the TS remains unknown.

Current commercial systems are based mainly on energy detection, which perform poorly for low signal-to-noise ratio (SNR) or in the presence of powerful co-channel jammers. Besides, energy detection techniques [see "Robust adaptive radar detection in the presence of steering vector mismatches", by De Maio, A., IEEE Transactions on Aerospace and Electronic Systems, Volume 41, Issue 4, p.p. 1322-1337, October 2005] report transmission activity without proper labeling the origins of such activity.

Existing alternatives are based on cyclostationary properties [see "Signal interception: a unifying theoretical framework for feature detection" by Gardner, W. A, IEEE Transactions on Communications, Volume 36, Issue 8, p.p. 897-906, August 1988] of the TS, but require spectral redundancy (i.e. excess bandwidth) and, furthermore, these approaches are affected by timing offset or jitter. Another handicap is that frequency location becomes hardly unrealistic in cyclostationary procedures, since it implies a double scanning in carrier frequency and cycle frequency. In addition to these inconveniences, cyclostationary procedures are not robust versus co-channel jammers and require quite a long data length.

Filter bank approaches are other possible alternative to detect and locate a TS. These techniques provide an estimated power level of the spectral shape contribution to a given data record and peaks close to the frequency at which the spectral shape is located. However, the classical solutions based using filter bank such as the Periodogram, the Maximum Likelihood Method (MLM) or the Normalized MLM result not to be robust for strong jammers and present low resolution. Other alternative is the Thomson's Multi-Taper spectrum estimation described in "Spectrum Estimation and Harmonic Analysis," by D. J. Thomson, Proceedings of the IEEE, vol. 70, no. 9, Sep. 1982, pp. 1055-1096. The method combines several distinct spectrum estimations to achieve a desired trade-off between spectral resolution and estimator variance. However, a significant drawback of this method is its high complexity.

An improved filter bank technique is the one disclosed in "Candidate Spectral Estimation for Cognitive Radio" by Rojas, M. A., Lagunas, M. A. and Pérez-Neira, A., Proceedings of the 11$^{th}$ WSEAS International Conference on Communications, pp. 8, Jul. 2007. This Spectral Estimation method for application in Cognitive Radio gives successful results for locating in frequency a given spectral shape forming part of a given data record. Basically, the filter-bank, instead of being tuned to a single carrier, is tuned to the spectral shape. However, this procedure is computationally complex as it requires a General Singular Value Decomposition (GSVD).

SUMMARY OF THE INVENTION

The invention which is described here allows detection of a target spectrum (TS), which forms part or contributes to a given data record, and also allows its location in frequency, with very low computational complexity, becoming a suitable solution to the limitations that have been commented above on the current commercial systems requires and not only.

The proposed invention provides an estimated power level of the contribution from the TS to the data record and peaks close to the frequency where the TS is located, without requiring computation of the GSVD, in a way alternative to the improved filter bank approach described in the aforementioned "Candidate Spectral Estimation for Cognitive Radio" by Rojas et al.

Aside from achieving a computational technique with low complexity for detecting and locating target spectra, another object of this invention is to detect and locate a specific spectral shape regardless of the presence of noise from strong jammers or any other interferers.

More precisely, an aspect of the invention is a method which comprises a first step for detecting the presence or absence of the target spectrum (TS) in input data by computing the autocorrelation matrix of the TS, the correlation matrix of the (N) samples from the original data and their determinants. Additionally, once the first step is performed and if the presence of a target spectrum is detected, the method proposed here further carries out a second step for locating said TS in frequency and estimates its power level even in the presence of strong jammers and interferers. The first step consists in a technique of TS detection which is independent of the frequency location obtained by the second step. This second step is based on locating the candidate or target spectrum by calculating a minimum variance.

Thanks to the low complexity of implementing the first step, since the proposed TS detection technique involves just computing the ratio of the determinants of the TS and the data correlation matrixes, it can be applied as a first detection step in the procedure disclosed in "Candidate Spectral Estimation for Cognitive Radio" (Rojas, et al, July 2007). If the absence of the TS is detected by this first step, computation of the GSVD (General Singular Value Decomposition) is avoided. In the present invention, the second step does not need GSVD either and is an alternative technique to locate the TS which, in contrast to the TS location proposed in "Candidate Spectral Estimation for Cognitive Radio" by Rojas et al., only requires to compute the ratio of the traces of determined Q-by-Q square matrixes.

The data input to the method consist of a data record composed by a certain number (N) of samples from the input original data signal, x(n). This input original data signal contains the target signal, white Gaussian noise (WGN) and possibly interference.

The target spectrum (TS) is determined by a modulated radiofrequency (RF) signal. Typically, TS may be an M-QAM modulated signal (Quadrature Amplitude Modulation with a number M of symbols in modulation constellation), for example, a low-level Binary Phase-Shift Keying (BPSK) or a Quadrature Phase-Shift Keying (QPSK) modulated spread spectrum signal.

The present method is for detecting as well as locating spectral shapes in radiofrequency (RF) signals and comprises the following steps:

- taking a number N of samples from an input data signal received at a front-end circuit of a RF receiver, thus obtaining a set of samples {x(n)},
- computing a data correlation matrix ($R_D$) from the set of samples of the input data signal x(n) and computing a target correlation matrix ($R_T$) from the target spectrum (TS) to be detected in the input data signal,
- minimizing a geodesic distance between the computed correlation matrixes,
- determining whether the target spectrum (TS) is present or not in the input data signal by comparing the minimized geodesic distance with a threshold ($\gamma_{th}$) of comparison.

The target correlation matrix ($R_T$) and the data correlation matrix ($R_D$) are square matrixes of dimension Q×Q, being Q<N (N: the number of samples); Q is also called the analysis order.

The data correlation matrix ($R_D$) of dimension Q is computed as $$R_D = \frac{1}{N} \sum_{n=1}^{N} x(n) \cdot x^H(n)$$

where x(n)={x(n) x(n-1) ... x(n-Q+1)} and $x^H(n)$ is the Hermitian transposed vector or sequence of x(n), i.e., $x^H(n)$ is formed by complex conjugate elements.

For a given Signal-to-Noise Ratio (SNR), the range of the threshold used to determine the presence/absence of the TS is defined as:

$$\gamma_{th} \in [\sigma^2 - \delta_n, \gamma + \delta_s] \quad \text{(equation 1)}$$

wherein $\sigma^2$ denotes the noise (WGN) power, $\gamma$ is a target power, and $\delta_n$ and $\delta_s$ results respectively from the estimation of the variance of the noise power and the target power. This variance depends on the: SNR, length of the data record and the analysis order.

The geodesic distance between two matrices $R_1$ and $R_2$ is defined as $$d_{geo}^2(R_1, R_2) = \sum_{q=1}^{Q} (Ln(\lambda(q)))^2$$

where $\lambda(q)$ are the generalized eigenvalues of the matrix pencil ($R_1, R_2$) such that $R_1 a_q = \lambda(q) \cdot R_2 \cdot a_q$. Taking into account this definition, the geodesic distance between the computed matrixes in the invention, the data correlation matrix $R_D$ and the target correlation matrix scaled by a factor $\gamma$ which represents the target power ($\gamma R_T$), is determined by:

$$d_{geo}^2(R_D, \gamma \cdot R_T) = \sum_{q=1}^{Q} |Ln(d(q)) - Ln(\gamma)|^2$$

and this geodesic distance is minimized by:

$$\gamma = \gamma_{GEO} = (det(R_T^{-1} \cdot R_D))^{1/Q} \quad \text{(equation 2)}$$

Thus, calculating the detection variable ($\gamma_{GEO}$) to which the threshold ($\gamma_{th}$) is compared for determining the presence of the target spectrum (TS) just involves computing the determinants of the target correlation matrix ($R_T$) and the data correlation matrix ($R_D$): det [$R_T$] and det[$R_D$] respectively. Q is the analysis order or length of the target and data correlation matrixes.

So far, the steps for detecting the target spectrum have been described. Additionally, the method comprises the following steps for locating said target spectrum (TS) in frequency:

- computing a scanning frequency vector (s) defined as s=[1 exp(jw) ... exp(j(Q-1)w)], wherein j denotes the imaginary unit, Q is the size of the target and data correlation matrixes ($R_T$, $R_D$) and w=2πf being f the scanning frequency
- computing a target modulated correlation matrix ($R_{TM}$) as:

$$R_{TM} = [(ss^H) \square R_T] \quad \text{(equation 3)}$$

wherein $\square$ denotes the elementwise or Schur-Hadamard product, $s^H$ is the Hermitian transpose of the scanning frequency vector (s) and $\gamma$ is the scale factor representing the target power.

Note that the data correlation matrix ($R_D$) can be equated in terms of the target correlation ($R_T$), the noise correlation $\sigma^2 I$ and interference correlation $R_I$, as $$R_D = \gamma((ss^H) \square R_T) + R_I + \sigma^2 I$$

where $\gamma$ is the target signal power and $\sigma^2$ is the WGN power.

The computation steps of the scanning frequency vector (s) and target modulated correlation matrix ($R_{TM}$) are performed for scanning in a frequency band of interest in order to determine the carrier frequency of the target spectrum (TS). The frequency band of interest is contained within this scanning range.

In addition, said scanning comprises the computations of:

- The minimum mean square error matrix from the target modulated correlation matrix ($R_{TM}$) and the target correlation matrix ($R_T$).
- A trace ratio ($\gamma_{MMSE}$) as:

$$\gamma_{MMSE}(w) = \frac{\text{Trace}(R_{TM})}{\text{Trace}(R_D^{-1} R_{TM}^2)} \quad \text{(equation 4)}$$

wherein Trace( ) denotes the trace operator and is applied on the target modulated correlation matrix ($R_{TM}$) and the data correlation matrix ($R_D$). This results from minimizing the Frobenius norm of the minimum mean square error matrix that has been computed in the first step.

The maximum value of the trace ratio ($\gamma_{MMSE}$) can be used to determine whether the target spectrum (TS) is present or not, if this trace ratio ($\gamma_{MMSE}$) is applied, instead of the power value obtained by minimizing the geodesic distance ($\gamma_{GEO}$), in a comparison with the threshold ($\gamma_{th}$) defined by the equation 1. In such case, the variance of the noise power ($\delta_n$) and the variance of the target power ($\gamma_s$) in equation 1 have to be re-estimated. The comparison between $\gamma_{MMSE}$ and $\gamma_{th}$ refines the method for the detection of TS using the geodesic distance described before.

This allows locating or identifying the scanning frequency vector (s) in a frequency at which the trace ratio ($\gamma_{MMSE}$) has a maximum value. This frequency is the carrier frequency of the TS.

Furthermore, the method allows obtaining an estimated value of the power level of the target spectrum (TS). A normalized power level Px(w) of TS, Px(w) normalized with respect to 1 W, is calculated as the maximum value of the trace ratio ($\gamma_{MMSE}$).

The disclosed method shows good performance for moderate data lengths in SNR ranges above those demanded by the application. In fact, the technique shows robustness versus co-channel jammers and it is able to detect the transmission activity of the TS even when it is far below of the jammer level on the same frequency band. This is the main feature of the proposed invention in front of existing alternatives and is due to the fact that the proposed invention nulls while searching along strong signals in adjacent bands.

Another aspect of the invention refers to a signal processing device which implements the method for detection and location of TS described before.

Another aspect of the invention refers to a radiofrequency receiver which comprises the signal processing device described before.

A last aspect of the invention is related to a computer program comprising computer program code means adapted to perform the steps of the described method for detection and location of a TS in a RF signal, when said program is run on a computer, a digital signal processor, a field-programmable gate array (FPGA), an application-specific integrated circuit (ASIC), a micro-processor, a micro-controller, or any other form of programmable hardware.

The described invention is applicable in Electronic Warfare because allows the passive use of electromagnetic spectrum to gain intelligence about other parties on the battlefield or in the communication spectrum in order to find, identify, locate, report about and intercept potential threats or targets, with very low complexity. Also, as the aforementioned filter bank approach, Cognitive Radio is a sector of wireless communications in which the present invention has application.

BRIEF DESCRIPTION OF THE DRAWINGS

To complete the description and in order to provide for a better understanding of the invention, a set of drawings is provided. Said drawings form an integral part of the description and illustrate a preferred embodiment of the invention, which should not be interpreted as restricting the scope of the invention, but just as an example of how the invention can be embodied. The drawings comprise the following figures.

DETAILED DESCRIPTION OF THE INVENTION

Figure 1:
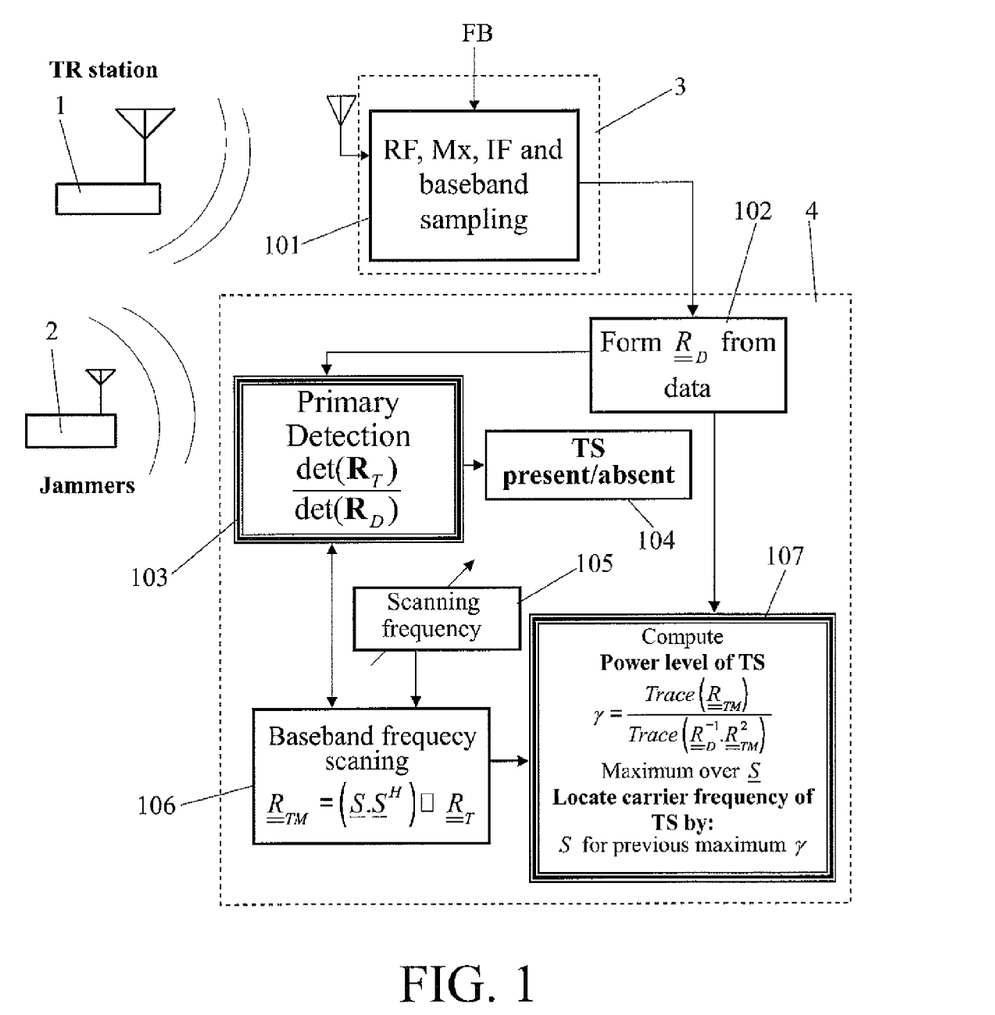
FIG. 1 shows a block diagram of a generic scenario in radiofrequency communications and a block diagram of the steps implementing a preferred embodiment of the invention and performed at a radiofrequency receiver in such scenario.

Here below a practical implementation of the invention is described for a generic scenario as illustrated in FIG. 1.

As part of a radiofrequency receiver performing the steps of the method for detecting and locating spectral shapes in radiofrequency signals shown in FIG. 1, there is a front-end circuit (3) with means for receiving in a frequency band at least one waveform of a RF signal and obtaining from it an input data signal at a baseband frequency. Also, the radiofrequency receiver comprises a signal processing device (4) which carries out the detection and location of a target spectrum (TS).

The front-end circuit (3) processes the received RF signal to obtain an input data signal to be further processed by the signal processing device (4). Firstly, said front-end circuit (3) of the radiofrequency receiver filters the RF signal to a frequency band of interest (FB). This front-end circuit (3) comprises a low noise power amplifier for amplifying the filtered signal. The next process performed by a local oscillator in the front-end circuit (3) is mixing the amplified and filtered signal in order to produce either a signal at intermediate frequency (IF) or a signal at baseband. In case that the signal is at intermediate frequency, the so-called IF sampling has to be carried out at the front-end circuit (3) in order to produce the in-phase and quadrature components of the complex IF signal; otherwise, the front-end circuit (3) performs baseband sampling to get base band data.

The method for detecting and locating spectral shapes in radiofrequency (RF) signals comprises a step of sampling (101) an input data signal, which is received at the front-end circuit (3) and results from one or several waveforms sent by a RF transmitting station (1) and possibly one or more interfering transmitters or jammers (2). A number N of samples is taken by the signal processing device (4) at certain synchronized time instants from the signal coming from the front-end circuit (3) of the RF receiver. Hence, the signal processing device (4) generates a collection of discrete time samples, which may be real-valued or complex-valued depending on the characteristics of the receiver. From the collection of N samples, a data correlation matrix ($R_D$) of dimension Q×Q, Q<N, is computed (102).

In addition to $R_D$, in the considered scenario of FIG. 1, a scanning frequency vector (s) is computed as:

$$s = [1\ en(jw) \ldots \exp(j(Q-1)w)],\ being\ w=2\pi f$$

The scanning frequency (f) is used to determine the frequency where the spectral target is located. Therefore, the defined problem is to find out if a given spectral target with an autocorrelation matrix or target correlation matrix ($R_T$) is present in data contaminated by other sources with different spectral shape.

More specifically, in order to explore the carrier frequency and the power level of the spectral target TS, a target modulated correlation is calculated by the equation 3, obtaining the target modulated correlation matrix ($R_{TM}$):

$$R_{TM} = [(ss^H) \square R_T]  \quad \text{(equation 3)}.$$

In equation 3, the target correlation is modulated using the component-product or Hadamard product, denoted by $\square$, of the zero frequency correlation target with a rank-one matrix formed by the components of the vector s at the scanning frequency.

The first step for detection of the target spectrum (103), independent of the frequency location, is applying equation 2 and compares the result to a threshold given by equation 1:

$$\gamma_{th} \in [\sigma^2 - \delta_n, \gamma + \delta_s]  \quad \text{(equation 1)}$$

$$\gamma_{GEO} = (det(\underline{R}_T^{-1} \underline{R}_D))^{1/Q}  \quad \text{(equation 2)}$$

The detection variable ($\gamma_{GEO}$) results from the minimization of the geodesic distance between the target correlation matrix ($R_T$) and the data correlation matrix ($R_D$). With this value and the threshold of comparison, the signal processing device (4) determines the presence or, otherwise, the absence of the target spectrum (104).

Once the target spectrum (TS) is detected, since a frequency location is also required and the scenario is contaminated with strong jammers or other interferers, the problem in the scenario of FIG. 1 becomes, given a data correlation matrix $R_D$, to find out in $R_{TM}$ the scanning frequency vector (s) corresponding to a frequency and a power level that better fit on the data correlation matrix $R_D$.

The solution comes from minimizing the Frobenius norm or the Hilbert-Schmidt norm of the Minimum Mean Square Error matrix. This error matrix results after filtering the data record with a MMSE matrix that aims at getting the target spectrum (TS).

The signal processing device (4) comprises frequency scanning means (105) for scanning in the frequency band of interest, the baseband in FIG. 1, which contains the target spectrum (TS).

The frequency contained in the target modulated correlation matrix ($R_{TM}$) is scanned (106) and when the maximum of the target power $\gamma = \gamma_{MMSE}(w)$ in equation 4 is obtained $$\gamma_{MMSE}(w) = \frac{\text{Trace}(R_{TM})}{\text{Trace}(R_D^{-1} R_{TM}^2)}  \quad \text{(equation 4)}$$

and if the detection of the target spectrum takes place, that is, the target spectrum is present whenever $\gamma$ in equation 4 surpasses the threshold $\gamma_{th}$ defined in equation 1,
the corresponding scanning frequency vector (s) gives the target signal frequency. This is the procedure explained in the final step of TS location (107), in FIG. 1.

Figure 2:
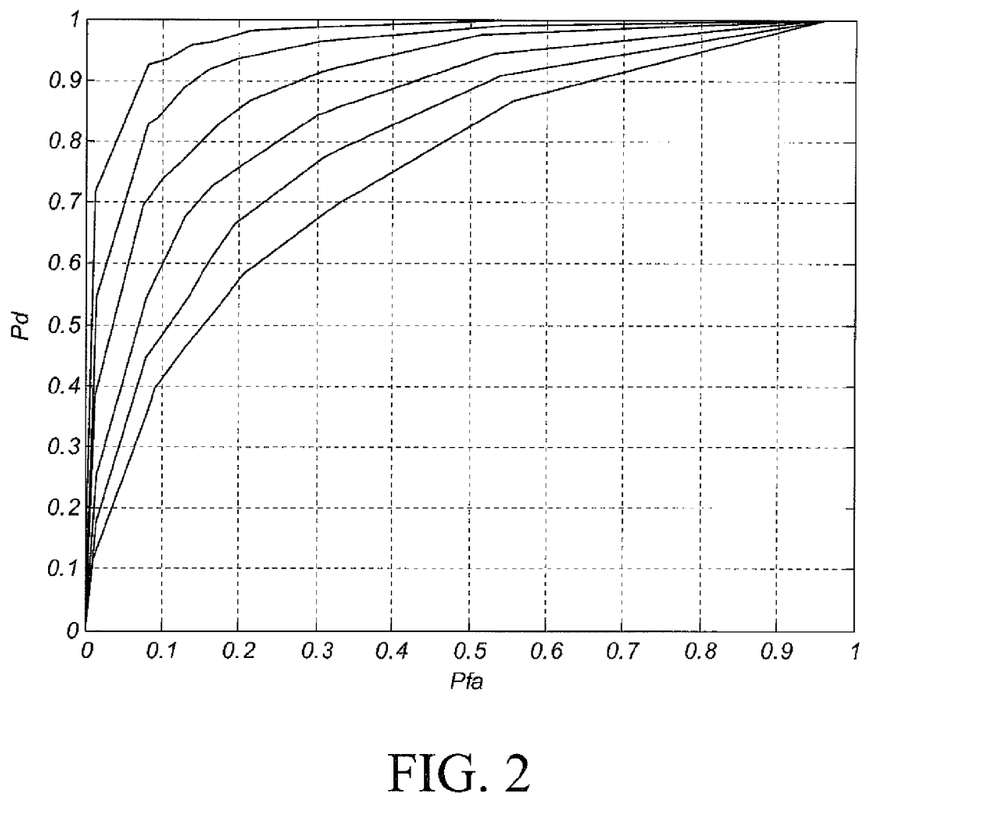
FIG. 2 shows a graphical representation of operating characteristic curves of the receiver (ROC curves) for different SNR values and obtained in practicing the TS detection step in accordance with a preferred embodiment of the invention, wherein the TS is a BPSK signal.

FIG. 2 is a graph of the results obtained in practicing the first detection step that is proposed in accordance with a preferred embodiment of the invention. Each curve represents an operating characteristic of the RF receiver—Receiver Operating Characteristic or ROC—; each point of the ROC curve is determined by the probability of detection (Pd) versus the probability of False Alarm (Pfa). Each point in the graph is computed with 5000 data records. Each record consists of N=200 samples. For each different value of the Signal-to-Noise-Ratio, a respective ROC curve is drawn: SNR ranges from −11 dB to −6 dB, the upper ROC curve corresponding to an SNR value of −11 dB and the lower ROC curve corresponds to SNR=−6 dB. In this scenario, the target spectrum (TS) consists of a BPSK signal with 4 samples per symbol and a frequency of 0.20. The analysis order of the target and data correlation matrixes is Q=8.

Figure 3:
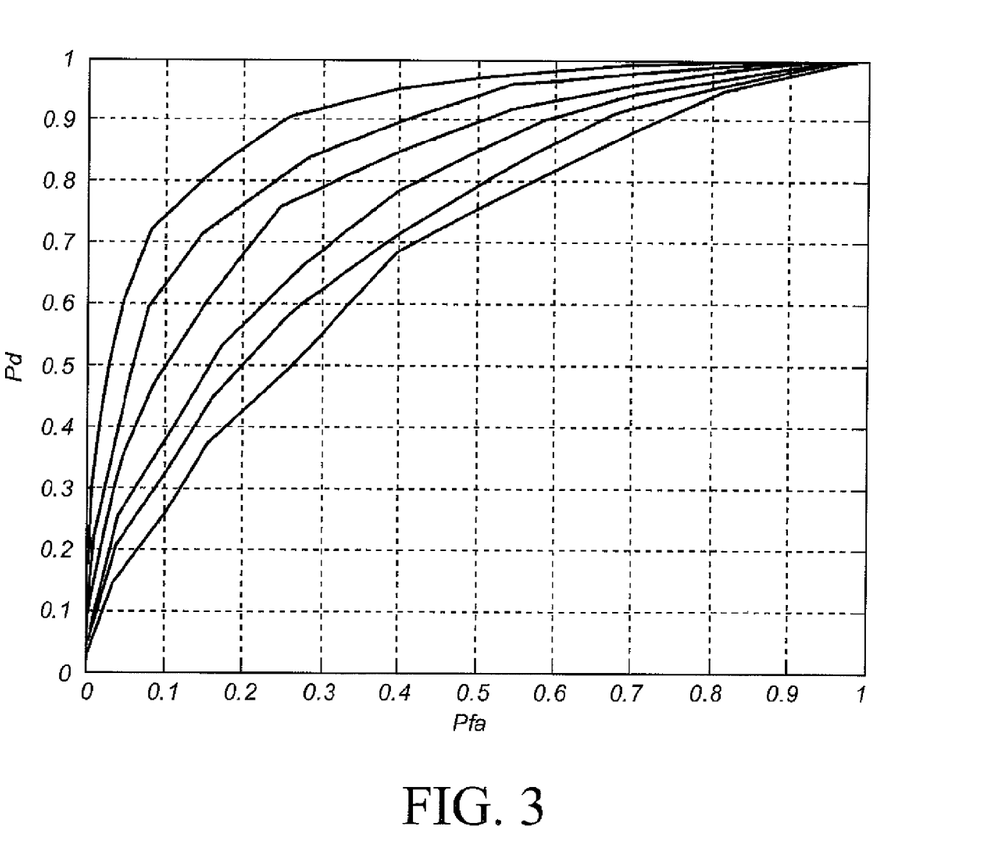
FIG. 3 shows a graphical representation of operating characteristic curves of the receiver (ROC curves) for different SNR values and obtained in practicing the TS detection step in accordance with the preferred embodiment of the invention and in the same scenario of FIG. 2, wherein the TS is a BPSK signal, but wherein an interferer is added.

FIG. 3 is a graph of the results obtained in practicing the first detection step that is proposed according to a preferred embodiment of the invention. The scenario is the same as in FIG. 2 but now there is interference at frequency 0.23. Each curve represents a ROC curve for a different SNR value. SNR ranges from −11 dB to −6 dB. The upper ROC curve corresponding to an SNR value of −11 dB and the lower ROC curve corresponds to SNR=−6 dB. Each point in the graph is computed with 5000 records. Each record consists of N=200 samples. The TS is a BPSK signal with 4 samples per symbol and a frequency of 0.20. The analysis order is Q=8.

The sensing errors decrease the system throughput because the miss-detection causes collision between the signals received from the RF transmitting station (1)-primary users- and the jammers (2)—secondary users—. Then, the false alarm results in the loss of secondary user's opportunities to use the channel. In order to plot the ROC curves for each of the TS locators shown in FIGS. 4-6 and for each SNR value, the same threshold $\gamma_{th}$ has been considered for both the probability of detection (Pd) and the probability of False Alarm (Pfa). For each SNR value, the range of this threshold $\gamma_{th}$ is $\gamma_{th} \in [(\sigma^2 - \delta_n, \gamma + \delta_s]$, being $\sigma^2$ equal to the noise power, $\gamma$ equal to the target power, $\delta_n$ and $\delta_s$ being the noise and candidate power variance estimated values respectively. In order to obtain equally spaced points in the different plots, for each SNR curve the threshold range has been sampled in a logarithmic way.

The curves depicted in FIGS. 2 and 3 are obtained when determining the presence of the TS by estimating the minimum value of the geodesic distance $\gamma_{GEO}$ and comparing it with the threshold $\gamma_{th}$.

Figure 4:
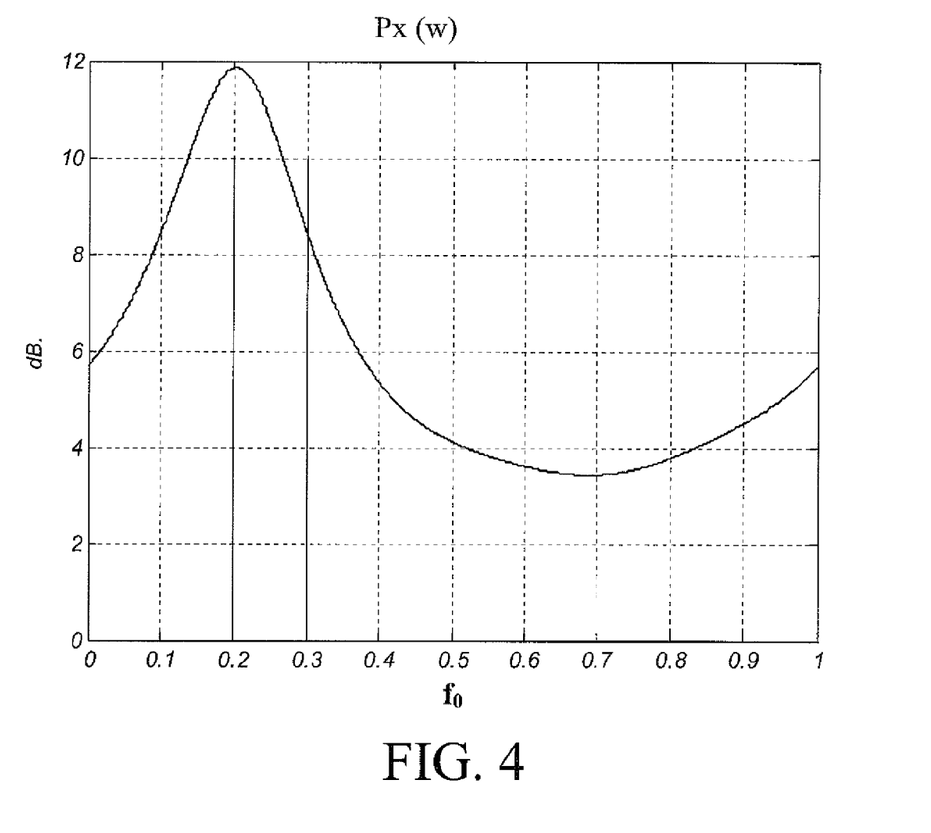
FIG. 4 shows a graphical representation of a normalized power in function of a normalized frequency with respect to frequency of sampling at the receiver, obtained in practicing the TS location step in accordance with a preferred embodiment of the invention and in a scenario, wherein the TS is a BPSK signal and the interference is a pure sinusoid.

FIG. 4 shows the performance of the second step that is proposed in accordance with a preferred embodiment of the invention. The TS has the following parameters: BPSK signal with 4 samples per symbol and SNR=10 dB at frequency 0.2. The interference is a pure sinusoid that is located at frequency 0.3 and with SNR=10 dB. The sample record consists of N=1000 samples and the analysis order is 16. For such scenario, a normalized power (Px(w)) with respect to 1 W is plotted versus w=$2\pi f_0$, where $f_0$ is the normalized frequency and is determined with respect to the frequency of sampling used by the front-end circuit (3) of the receiver. The values of the normalized power (Px(w)) depicted in FIG. 4 are obtained by applying equation 2, i.e, here Px(w)=$\gamma_{MMSE}$.

Figure 5:
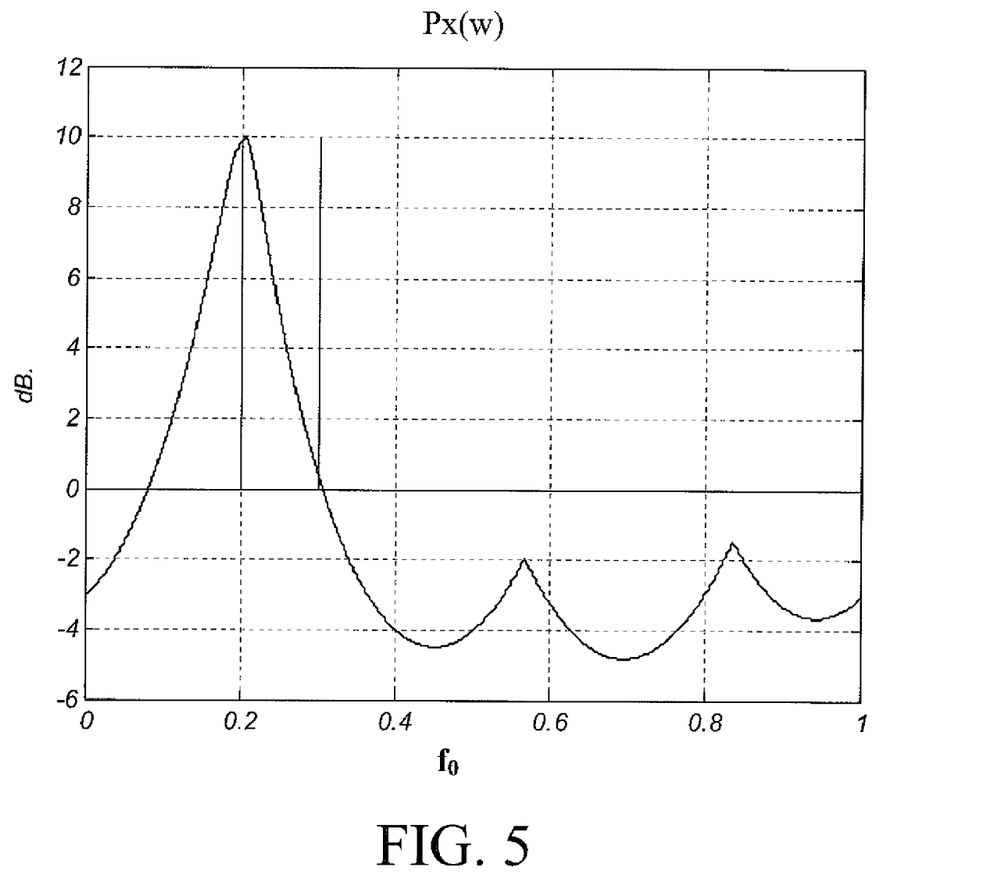
FIG. 5 shows a graphical representation of a normalized power in function of a normalized frequency with respect to frequency of sampling at the receiver, obtained in practicing an spectral estimation in accordance with a filter bank technique as known in the state of the art and in the same scenario of FIG. 4, wherein the TS is a BPSK signal and the interference is a pure sinusoid.

FIG. 5 shows the TS estimation that is provided by the improved filter bank technique described in "Candidate Spectral Estimation for Cognitive Radio" by Rojas et al. [see Proceedings of the 11$^{th}$ WSEAS International Conference on Communications, pp. 8, Jul. 2007]. The scenario is the same as in FIG. 4 and the plot also represents the normalized power (Px(w)) versus w=$2\pi f_0$, being $f_0$ the aforesaid normalized frequency. The TS has the following parameters: BPSK signal with 4 samples per symbol and SNR=10 dB at frequency 0.2. The interference is a pure sinusoid that is located at frequency 0.3 and with SNR=10 dB. The sample record consists of N=1000 samples and the analysis order is Q=16.

The curves depicted in FIGS. 4 and 5 are obtained using the power value $\gamma_{MMSE}$ also for comparing it with the threshold $\gamma_{th}$ in order to refine the detection of the TS.

Figure 6:
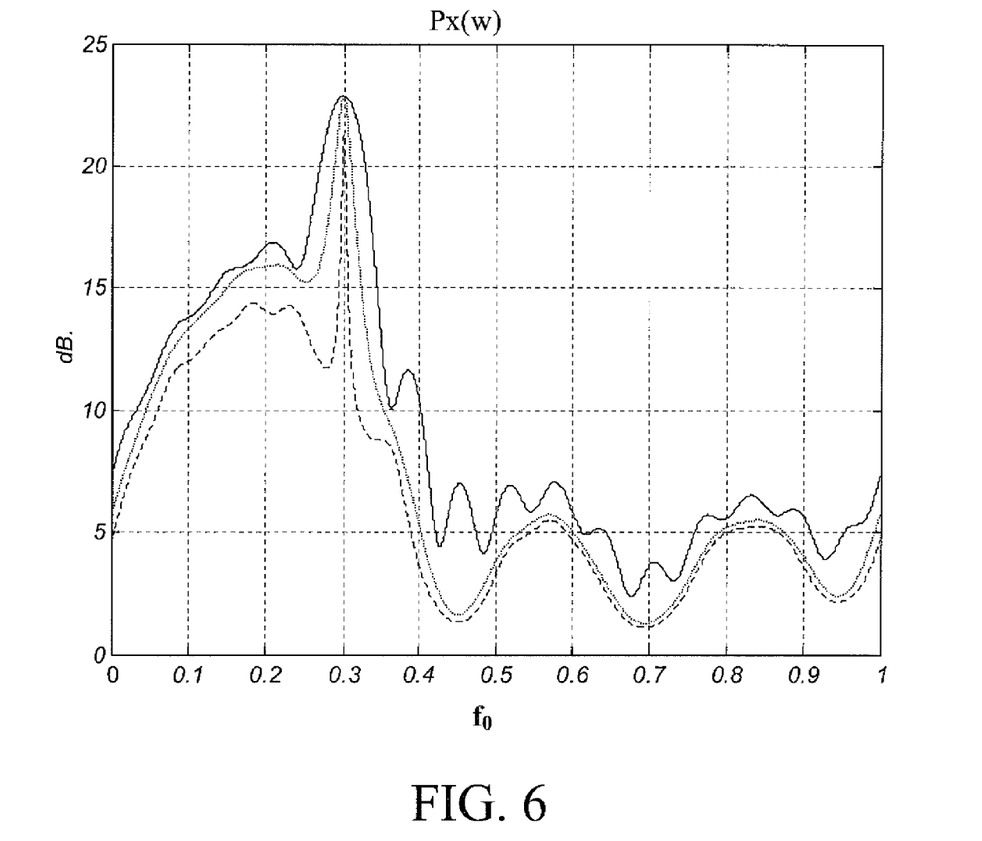
FIG. 6 shows a graphical representation of a normalized power in function of a normalized frequency with respect to frequency of sampling at the receiver, obtained in practicing an spectral estimation in accordance with other filter bank techniques, Maximum Likelihood Method and Normalized MLM, as known in the state of the art and in the same scenario of FIGS. 4-6, wherein the TS is a BPSK signal and the interference is a pure sinusoid.

FIG. 6 shows the performance of 3 classical filter bank approaches, from top to down: periodogram, Maximum Likelihood Method (MLM) and Normalized MLM (NMLM). The scenario is the same as in FIG. 4. Each plot represents the aforementioned normalized power (Px(w)). The TS has the following parameters: BPSK signal with 4 samples per symbol and SNR=10 dB at frequency 0.2. The interference is a pure sinusoid that is located at frequency 0.3 and with SNR=10 dB. The sample record consists of N=1000 samples and the analysis order is Q=16. When comparing FIGS. 4 and 6, the performance of the step for locating the TS in accordance with a preferred embodiment of the invention results to be higher than the performance of classical filter bank approaches in the same scenario with strong jammers.

In this text, the term "comprises" and its derivations (such as "comprising", etc.) should not be understood in an excluding sense, that is, these terms should not be interpreted as excluding the possibility that what is described and defined may include further elements, steps, etc.

The invention is obviously not limited to the specific embodiments described herein, but also encompasses any variations that may be considered by any person skilled in the art (for example, as regards the choice of components, configuration, modification of the constraints at the output of the matrix filter, etc.), within the general scope of the invention as defined in the appended claims.

Some preferred embodiments of the invention are described in the dependent claims which are included next.

The invention claimed is:

1. A method for detecting spectral shapes in radiofrequency signals, the method comprising:
   (a) taking a number N of samples from an input data signal,
   (b) computing a data correlation matrix ($R_D$) of dimension Q×Q from Q of the N samples,
   (c) computing a target correlation matrix ($R_T$) of a target spectrum (TS) to be detected in the input data signal,
   (d) minimizing a geodesic distance between the target correlation matrix ($R_T$) and the data correlation matrix ($R_D$),
   (e) determining whether the target spectrum (TS) is present or not in the input data signal by comparing a detection variable ($\gamma_{GEO}$), which is the minimized geodesic distance, with a threshold of comparison.

2. The method of claim 1, wherein minimizing the geodesic distance between the target correlation matrix ($R_T$) and the data correlation matrix ($R_D$) comprising calculating the detection variable ($\gamma_{GEO}$) as:

$$\gamma_{GEO} = (det(\underline{R}_T^{-1} \cdot \underline{R}_D))^{1/Q},$$

wherein $det[R_T]$ and $det[R_D]$ denotes the determinants of the target correlation matrix ($R_T$) and the data correlation matrix ($R_D$) respectively and Q is the size of said target and data correlation matrixes ($R_T$, $R_D$).

3. The method of claim 1, wherein the threshold of comparison for determining the presence of the target spectrum (TS) is $\gamma_{th} \in [\sigma^2 - \delta_n \cdot \gamma + \delta_s]$, being $\gamma$ a target power and $\sigma^2$ a noise power, $\delta_n$ is an estimated value of the variance of the noise power $\sigma^2$ and $\delta_s$ is an estimated value of the variance of the target power $\gamma$.

4. The method for locating spectral shapes which comprises detecting a target spectrum (TS) according to claim 1, further comprising a step of scanning in a frequency band of interest centered on a scanning frequency to determine a carrier frequency of the target spectrum (TS).

5. The method according to claim 4, wherein the step of scanning comprising:
   computing a scanning frequency vector (s) defined as s=[1 exp(jw) ... exp(j(Q-1)w], wherein j denotes the imaginary unit, Q is the size of the target and data correlation matrixes ($R_T$, $R_D$) and w=2πf being f the scanning frequency computing a target modulated correlation matrix ($R_{TM}$) as:

$$R_{TM} = [(SS^H) \square R_T]$$

wherein $\square$ denotes the Hadamard product, $s^H$ is the Hermitian matrix of the scanning frequency vector (s) and γ is a scale factor.

6. The method according to claim 5, wherein the step of scanning further comprising locating the scanning frequency vector (s) in the target modulated correlation matrix ($R_{TM}$) at the frequency band of interest.

7. The method according to claim 6, wherein the step of scanning further comprising:
   computing a minimum mean square error matrix from the target modulated correlation matrix ($R_{TM}$) and the target correlation matrix ($R_T$),
   minimizing the Frobenius norm of the minimum mean square error matrix by computing a trace ratio ($\gamma_{MMSE}$) as:

$$\gamma_{MMSE}(w) = \frac{\text{Trace}(R_{TM})}{\text{Trace}(R_D^{-1} R_{TM}^2)}$$

wherein Trace( ) denotes the trace operator and is applied on the target modulated correlation matrix ($R_{TM}$) and the data correlation matrix ($R_D$),
   computing the scanning frequency vector (s) in a frequency at which the trace ratio ($\gamma_{MMSE}$) has a maximum value.

8. The method according to claim 7, further comprising:
   estimating a normalized power level Px(w) of the target spectrum (TS) as the maximum value of the trace ratio ($\gamma_{MMSE}$).

9. A signal processing device configured to take samples from an input data signal with a baseband frequency and comprising:
   a target spectrum detector performing the steps of
   (a) taking a number N of samples from an input data signal,
   (b) computing a data correlation matrix (RD) of dimension Q×Q from Q of the N samples,
   (c) computing a target correlation matrix (RT) of a target spectrum (TS) to be detected in the input data signal,
   (d) minimizing a geodesic distance between the target correlation matrix (RT) and the data correlation matrix (RD),
   (e) determining whether the target spectrum (TS) is present or not in the input data signal by comparing a detection variable (γGEO), which is the minimized geodesic distance, with a threshold of comparison.

10. The signal processing device according to claim 9, further comprising:
    a target spectrum locator connected to the target spectrum detector and canning in a frequency band of interest centered on a scanning frequency to determine a carrier frequency of the target spectrum (TS) when a target spectrum is detected.

11. A radio frequency receiver comprising:
    a front-end circuit with means for receiving radiofrequency signals in a frequency band and obtaining an input data signal at a baseband frequency, and
    the signal processing device into which the front-end circuit inputs the input data signal to and which comprises target spectrum detector performing the steps of
    (a) taking a number N of samples from an input data signal, (b) computing a data correlation matrix (RD) of dimension Q×Q from Q of the N samples,
(c) computing a target correlation matrix (RT) of a target spectrum (TS) to be detected in the input data signal,
(d) minimizing a geodesic distance between the target correlation matrix (RT) and the data correlation matrix (RD),
(e) determining whether the target spectrum (TS) is present or not in the input data signal by comparing a detection variable ($\gamma$GEO), which is the minimized geodesic distance, with a threshold of comparison.

12. The method of claim 1, wherein the method is implemented as a computer program comprising computer program code means when said program is run on a computer, a digital signal processor, a FPGA, an ASIC, a micro-processor, a micro-controller, or any other form of programmable hardware.

* * * * *